United States Patent
Kang et al.

(10) Patent No.: US 12,020,738 B2
(45) Date of Patent: Jun. 25, 2024

(54) MEMORY DEVICE AND OPERATING METHOD THEREOF

(71) Applicant: Samsung Electronics Co., Ltd., Suwon-si (KR)

(72) Inventors: Dong-Seok Kang, Suwon-si (KR); Sun Young Kim, Seoul (KR); Hye-Ran Kim, Uiwang-si (KR); Tae-Yoon Lee, Suwon-si (KR); Sung Yong Cho, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 116 days.

(21) Appl. No.: 17/536,537

(22) Filed: Nov. 29, 2021

(65) Prior Publication Data

US 2022/0270662 A1    Aug. 25, 2022

(30) Foreign Application Priority Data

Feb. 25, 2021 (KR) .......................... 10-2021-0025397

(51) Int. Cl.
*G06F 3/06* (2006.01)
*G11C 11/406* (2006.01)

(52) U.S. Cl.
CPC .......... *G11C 11/406* (2013.01); *G06F 3/0604* (2013.01); *G06F 3/0659* (2013.01); *G06F 3/0673* (2013.01)

(58) Field of Classification Search
CPC ............ G11C 11/406; G11C 11/40603; G11C 11/40611; G11C 11/40618; G06F 3/0604; G06F 3/0659; G06F 3/0673
USPC .......................................................... 365/222
See application file for complete search history.

(56) References Cited

U.S. PATENT DOCUMENTS

| | | | |
|---|---|---|---|
| 6,438,055 B1 * | 8/2002 | Taguchi | G11C 11/406 365/222 |
| 6,967,885 B2 * | 11/2005 | Barth, Jr | G11C 11/40618 365/189.04 |
| 9,761,297 B1 | 9/2017 | Tomishima | |
| 9,892,779 B2 | 2/2018 | Kang et al. | |
| 10,061,541 B1 | 8/2018 | Lee | |
| 10,607,679 B2 | 3/2020 | Nakaoka | |

(Continued)

FOREIGN PATENT DOCUMENTS

| | | |
|---|---|---|
| KR | 10-0560579 B1 | 3/2006 |
| KR | 2017-0112786 A | 10/2017 |

OTHER PUBLICATIONS

European Office Action dated May 18, 2022 issued in corresponding European Appln. No. 21209508.7.

(Continued)

*Primary Examiner* — Ly D Pham
(74) *Attorney, Agent, or Firm* — HARNESS, DICKEY & PIERCE, P.L.C.

(57) ABSTRACT

A memory device and an operating method of the memory device are provided. The operating method comprises receiving an activation-refresh command from a memory controller, decoding a target address and an internal command from the activation-refresh command, and performing an activation operation based on the internal command for the target address and performing a refresh operation on at least one block to which the target address does not belong.

19 Claims, 11 Drawing Sheets

(56) References Cited

U.S. PATENT DOCUMENTS

| | | | |
|---|---|---|---|
| 2008/0151670 A1* | 6/2008 | Kawakubo | G11C 11/406 365/222 |
| 2009/0094412 A1* | 4/2009 | Markevitch | G06F 13/16 711/E12.001 |
| 2013/0254475 A1 | 9/2013 | Perego et al. | |
| 2016/0055896 A1* | 2/2016 | Lim | G11C 11/40615 365/149 |
| 2016/0163377 A1 | 6/2016 | Oh et al. | |
| 2016/0196863 A1* | 7/2016 | Shin | G11C 11/4087 365/222 |
| 2016/0225432 A1* | 8/2016 | Cha | G11C 11/40618 |
| 2017/0178715 A1* | 6/2017 | Lee | G11C 11/4076 |
| 2018/0151215 A1* | 5/2018 | Ware | G06F 13/1605 |
| 2019/0073161 A1 | 3/2019 | Nale | |
| 2019/0228814 A1* | 7/2019 | Morohashi | G11C 11/4097 |
| 2020/0043545 A1 | 2/2020 | Gans | |
| 2020/0051617 A1* | 2/2020 | Joo | G11C 11/40618 |
| 2020/0168268 A1* | 5/2020 | Bessho | G11C 11/4076 |
| 2020/0321049 A1* | 10/2020 | Meier | G11C 11/40622 |
| 2021/0335416 A1* | 10/2021 | Joo | G11C 11/4085 |
| 2022/0093169 A1* | 3/2022 | Asami | G11C 11/40615 |
| 2022/0148647 A1* | 5/2022 | Johnson | G11C 11/408 |

OTHER PUBLICATIONS

European Search Report dated May 6, 2022 issued in corresponding European Appln. No. 21209508.7.

* cited by examiner

MEMORY DEVICE AND OPERATING METHOD THEREOF

CROSS-REFERENCE TO RELATED APPLICATION

This application claims priority from Korean Patent Application No. 10-2021-0025397 filed on Feb. 25, 2021 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a memory device, and more particularly, to a memory device that performs an efficient refresh operation, an operating method thereof, and a memory system including the same.

2. Description of the Related Art

Semiconductor memory devices for storing data may be generally classified into a volatile memory device and a non-volatile memory device. The volatile memory device such as a dynamic random access memory (DRAM) or the like, which stores data by charging or discharging a cell capacitor, maintains the stored data while a power is being applied but loses the stored data when the power is cut off. On the other hand, the non-volatile memory device can store data even when the power is cut off. The volatile memory device is mainly used as a main memory for a computer or the like, and the non-volatile memory device is used as a large-capacity memory for storing programs and data in a wide range of application devices such as a computer, a mobile communication device, and the like.

In the volatile memory device such as a DRAM or the like, cell charges stored in a memory cell may be lost due to a leakage current. Before the cell charges are lost and the data is completely destroyed, the charges of the memory cell may be recharged. Such recharge of the cell charges is referred to as a refresh operation. The refresh operation is performed repeatedly before the cell charges are lost.

With the development of a process technique such as an increase in the degree of integration, a gap between cells of a DRAM becomes gradually narrower. Further, due to the reduction of the gap between the cells, disturbance from adjacent cells or word lines serves as an important data integrity factor. Even when the disturbance affects a specific cell, it is difficult for a random access memory such as a DRAM to restrict an access to a specific address. Therefore, disturbance may occur in a specific cell, and this affects refresh characteristics of the cell.

SUMMARY

Some example embodiments of the present disclosure provide a memory device in which data integrity is improved by reducing or preventing a row-hammer phenomenon in a memory device that is gradually shrunk, and an operating method thereof.

Some example embodiments of the present disclosure also provide a memory device in which product performance is improved by simultaneously performing an activation operation and a refresh operation, and an operating method thereof.

According to some example embodiments, an operating method of a memory device may include receiving an activation-refresh command from a memory controller, decoding a target address and an internal command from the activation-refresh command, and performing an activation operation based on the internal command for the target address and performing a refresh operation on at least one block to which the target address does not belong.

According to some example embodiments, a memory device may include a memory control logic configured to generate a first control signal for performing an activation operation for a target address based on an activation-refresh command received from a memory controller, at least one bank array including a first block to which the target address belongs and a plurality of second blocks to which the target address does not belong, a refresh controller configured to generate a second control signal for performing a refresh operation on the second block, a bank control logic configured to output a bank control signal for activating the bank array to which the target address belongs and a plurality of bank row selection decoders, at least one of which is configured to be selected and activated based on the first control signal, the second control signal, and the bank control signal, wherein the activated bank row selection decoder is configured to, in an activation period, apply an activation driving voltage to a word line of the target address, and simultaneously apply a refresh driving voltage to a word line of a refresh address, and the refresh address belongs to at least one block among the plurality of second blocks.

According to some example embodiments, a memory controller includes a control logic configured to operation of the memory controller and/or selectively transmit any one of an activation command, a refresh command, a refresh management (RFM) command, or an activation-refresh command to a memory device, and a plurality of bank counters mapped respectively to a plurality of bank arrays of the memory device, each bank counter including a plurality of block counters, wherein the control logic is configured to increase a count value of a first block counter corresponding to a first block to which a target address belongs in response to the activation command or the activation-refresh command being transmitted to the memory device.

According to some example embodiments, an operating method of a memory system, includes transmitting, by a memory controller, an activation-refresh command to a memory device and performing, by the memory device, an activation operation at a target address of a first block while performing a refresh operation in a second block.

However, example embodiments of the present disclosure are not restricted to those set forth herein. The above and other example embodiments of the present disclosure will become more apparent to one of ordinary skill in the art to which the present disclosure pertains by referencing the detailed description of the present disclosure given below.

BRIEF DESCRIPTION OF THE DRAWINGS

The above and other example embodiments and features of the present disclosure will become more apparent by describing in detail example embodiments thereof with reference to the attached drawings, in which.

DETAILED DESCRIPTION

Although the terms first, second, etc. may be used herein to describe various elements or components, these elements or components should not be limited by these terms. These terms are used to distinguish one element or component from another element or component. Thus, a first element or component discussed below could be termed a second element or component without departing from the teachings of the present disclosure.

Hereinafter, example embodiments of the present disclosure will be described with reference to the accompanying drawings.

Figure 1:
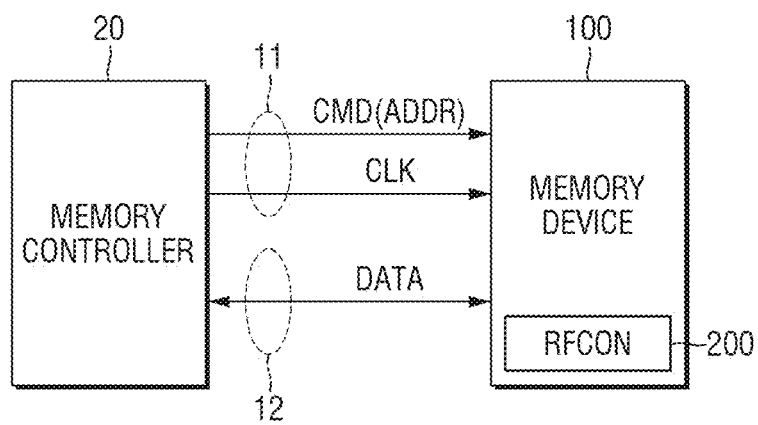
FIG. 1 is a block diagram showing a memory system according to some example embodiments.
Figure 2:
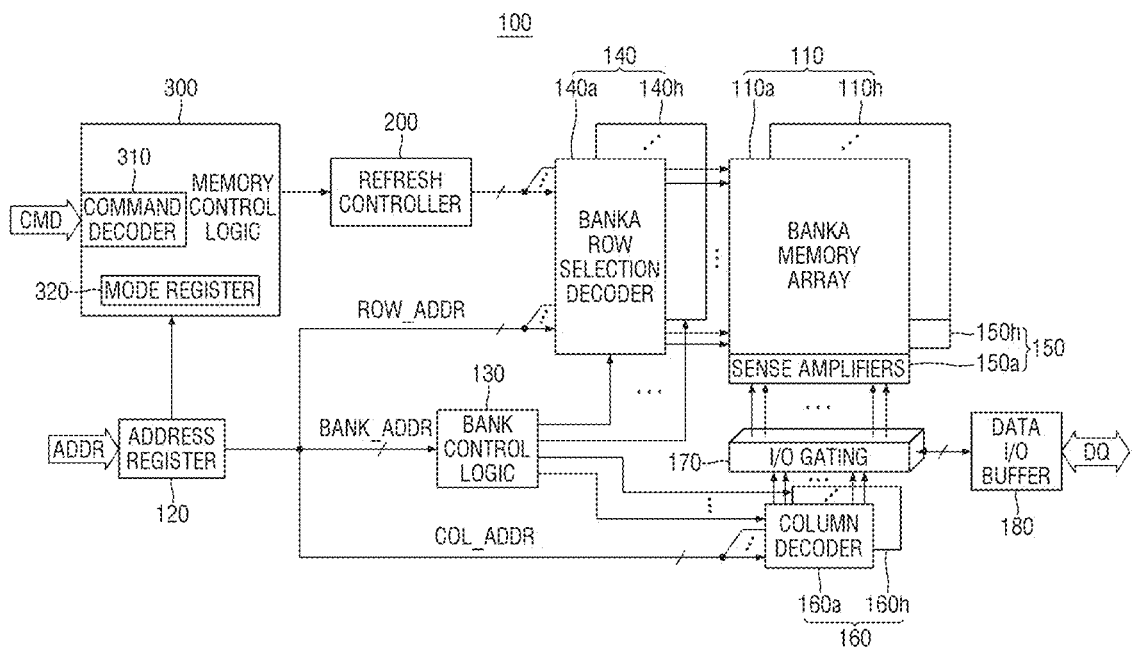
FIG. 2 is a block diagram showing one example embodiment of a memory device included in the memory system of FIG. 1.
Figure 3:
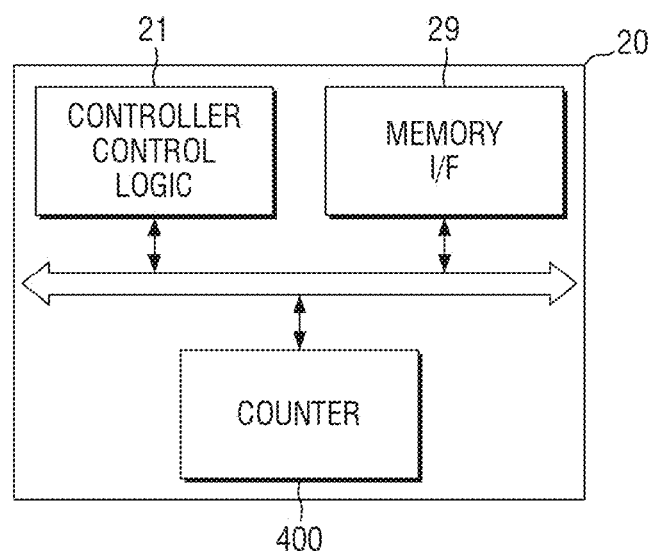
FIG. 3 is a block diagram showing one example embodiment of a memory controller included in the memory system of FIG. 1.
Figure 4:
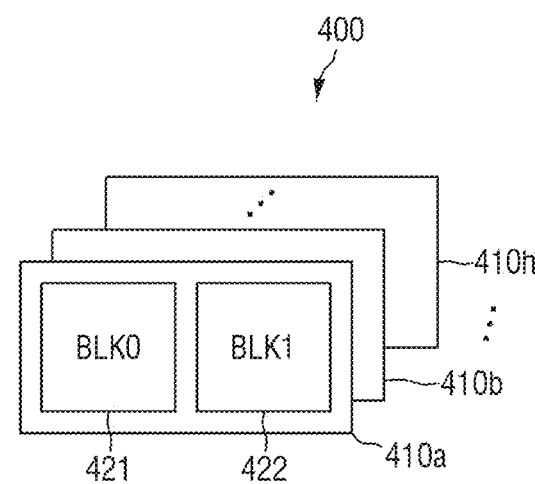
FIG. 4 is a diagram showing a bank counter included in the memory controller of FIG. 3.

FIG. 1 is a block diagram showing a memory system according to some example embodiments, and FIG. 2 is a block diagram showing one example embodiment of a memory device included in the memory system of FIG. 1. FIG. 3 is a block diagram showing one example embodiment of a memory controller included in the memory system of FIG. 1, and FIG. 4 is a diagram showing a bank counter included in the memory controller of FIG. 3.

Referring to FIG. 1, a memory system 10 includes a memory controller 20 and/or a memory device 100. Each of the memory controller 20 and the memory device 100 includes an interface for communication therebetween. The interfaces may be connected through a control bus 11 for transmitting a command CMD, an address ADDR, a clock signal CLK, and/or the like, and/or a data bus 12 for transmitting data. The command CMD may be considered to include the address ADDR. The memory controller 20 may generate the command CMD for controlling the memory device 100, and data DATA may be written in the memory device 100 and/or read from the memory device 100 under the control of the memory controller 20. The memory device 100 may transmit data read from a memory cell, state information of the memory device, and/or the like through the data bus 12.

Referring to FIG. 2, in some example embodiments, the memory device 100 may include a memory control logic 300, an address register 120, a bank control logic 130, a row selection circuit 140, a column decoder 160, a memory cell array 110, a sense amplifier 150, an I/O gating circuit 170, a data I/O buffer 180, and/or a refresh controller 200.

The memory cell array 110 may include a plurality of memory banks, e.g., a plurality of bank arrays 110a to 110h. The row selection circuit 140 may include a plurality of bank row selection circuits 140a to 140h connected to the plurality of bank arrays 110a to 110h, respectively. The column decoder 160 may include a plurality of column decoders 160a to 160h connected to the plurality of bank arrays 110a to 110h, respectively. The sense amplifier 150 may include a plurality of sense amplifiers 150a to 150h connected to the plurality of bank arrays 110a to 110h, respectively.

Each, or one or more, of the bank arrays 110a to 110h may include a plurality of blocks BLK0 to BLKn. For example, any one activated bank array (e.g., the bank array 110a) may include a first block (e.g., the block BLK0) to which a target address used for performing an activation operation belongs and at least one second block (the remaining blocks except the block BLK0) to which the target address does not belong. The first block and the second block may be connected to separate bit line sensing areas, so that a driving voltage may be applied to the target row of the first block and a refresh voltage may be applied to any one word line (e.g., a refresh address) of the second block.

The address register 120 may receive the address ADD including a bank address BANK_ADDR, a row address ROW_ADDR, and/or a column address COL_ADDR from the memory controller. The address register 120 may provide the received bank address BANK_ADDR to the bank control logic 130, provide the received row address ROW_ADDR to the row selection circuit 140, and/or provide the received column address COL_ADDR to the column decoder 160.

The bank control logic 130 may generate bank control signals in response to the bank address BANK_ADDR. In response to the bank control signals, the bank row selection circuit corresponding to the bank address BANK_ADDR among the plurality of bank row selection circuits 140a to 140h may be activated, and the bank column decoder corresponding to the bank address BANK_ADDR among the plurality of bank column decoders 160a to 160h may be activated.

The row address ROW_ADDR outputted from the address register 220 may be applied to each or one or more of the bank row selection circuits 140a to 140h. The bank row selection circuit activated by the bank control logic 130 among the bank row selection circuits 140a to 140h may decode the row address ROW_ADDR to activate the word line corresponding to the row address. For example, the activated bank row selection circuit may apply a word line driving voltage to the word line corresponding to the row address. For example, the activated bank row selection circuit 140a may apply an activation driving voltage to the word line of the target address and may apply a refresh driving voltage to the word line of the refresh address.

The column decoder 160 may include a column address latch. The column address latch may receive the column address COL_ADDR from the address register 120 and may temporarily store the received column address COL_ADDR. Further, the column address latch may gradually increase the received column address COL_ADDR in a burst mode. The column address latch may apply the temporarily stored or gradually increased column address COL_ADDR to each or one or more of the bank column decoders 160*a* to 160*h*.

The bank column decoder activated by the bank control logic 130 among the bank column decoders 160*a* to 160*h* may activate the sense amplifier corresponding to the bank address BANK_ADDR and column address COL_ADDR through the I/O gating circuit 170.

The I/O gating circuit 170 may include, together with circuits for gating I/O data, an input data mask logic, read data latches for storing data outputted from the bank arrays 110*a* to 110*h*, and/or write drivers for writing data in the bank arrays 110*a* to 110*h*.

The data DQ to be read from any one of the bank arrays 110*a* to 110*h* may be detected by the sense amplifier (any one of the sense amplifiers 150*a* to 150*h*) corresponding to the one bank array, and stored in the read data latches. The data DQ stored in the read data latches may be provided to the memory controller through the data I/O buffer 180. The data DQ to be written in any one of the bank arrays 110*a* to 110*h* may be provided from the memory controller to the data I/O buffer 180. The data DQ provided to the data I/O buffer 180 may be written in the one bank array through the write drivers.

The refresh controller 200 may control the bank row selection circuit of the memory device 100 such that a refresh operation is performed during a pre-charge period tPRE or a row active time tRAS for an activation access operation. For example, the refresh controller 200 may control the bank row selection circuit of the memory device 100 such that the refresh operation is performed on any one bank array 110*a* activated by the bank control logic 130 during the pre-charge period tREF based on a normal refresh command REF CMD or a refresh management command RFM CMD. For example, the refresh controller 200 may control the bank row selection circuit of the memory device 100 such that the refresh operation is performed on the second block to which a target address does not belong during the row active time tRAS based on an activation-refresh command ACTR CMD.

The memory control logic 300 may control the overall operation of the memory device 100. In some example embodiments, the memory control logic 300 may generate first control signals such that the activation operation, e.g., a write operation and/or a read operation, is performed in the memory device 100. In some example embodiments, the memory control logic 300 may control the refresh controller 200 using a refresh controller control signal such that the refresh operation is performed in the memory device 100.

The memory control logic 300 includes a command decoder 310 and/or a mode register set (MRS) (320). In some example embodiments, the command decoder 310 may decode the command CMD received from the memory controller 20, and the mode register set 320 may store values for controlling the operation of the memory device 100. In some example embodiments, the command decoder 310 may decode the command CMD received from the memory controller 20 and refer to the values stored in the mode register set 320 to generate an internal command. In some example embodiments, the mode register set 320 may store a rolling accumulated ACT initial management threshold (RAAIMT) count and/or a rolling accumulated ACT maximum management threshold (RAAMMT) count. The mode register set 320 may transmit the RAAIMT count and/or the RAAMMT count to the memory controller 20. The mode register set 320 may transmit the RAAIMT count and the RAAMMT count to the memory controller 20 based on, e.g., a mode register read command from the memory controller 20, and/or based on an initial system setting of the memory device in another example, and/or based on the determination of the memory control logic 300 in still another example.

For example, when an activation command ACT CMD is received, the memory control logic 300 may decode the target address and the internal command to generate a first control signal for performing the activation operation. The first control signal may include one or more control signals for the components in the memory device 100 required, or sufficient, to perform the activation command.

In another example, when an activation-refresh command ACTR CMD is received, the memory control logic 300 may decode the target address and internal command to generate the first control signal for the activation operation and the refresh controller control signal for the refresh operation. The refresh controller 200 may generate a second control signal for performing the refresh operation for the refresh address during the row active time tRAS based on the refresh controller control signal.

In still another example, when a refresh command REF CMD is received, the memory control logic 300 may generate the refresh controller control signal, and the refresh controller 200 may generate the second control signal for performing the refresh operation for the refresh address during a pre-charge time tRP based on the refresh controller control signal.

Although it is illustrated in FIG. 2 that the memory control logic 300 and the address register 120 are separate components, the memory control logic 300 and the address register 120 may be implemented as one inseparable component. Further, although it is illustrated in FIG. 2 that the command CMD and the address ADDR are provided as separate signals, the address may be considered to be included in the command, as specified by LPDDRS standards or the like.

The refresh controller 200 generates the second control signals for controlling the refresh operation of the memory device 100. As described above, depending on example embodiments, the refresh controller 200 may control the row selection circuit 140 such that the refresh operation is performed during the row active time tRAS for the access operation or the pre-charge time tRP.

In some example embodiments, the memory controller 20 may include a controller control logic 21 and/or a bank counter 400, as shown in FIG. 3.

When an access request to the memory device 100 is received from an external device (not shown), the memory controller 20 determines the command CMD related to the access request using the controller control logic 21. The memory controller 20 may transmit the command CMD to the memory device 100 to control the overall operation of the memory device 100.

The bank counter 400 may be a plurality of bank counters 410*a* to 410*h* mapped to the plurality of bank arrays 110*a* to 110*h*, respectively. One bank counter (e.g., the bank counter 410*a*) may include a plurality of block counters 421 and 422.

In one example, as shown in FIG. 4, one bank counter (e.g., the bank counter 410a) may include a first block (e.g., BLK0) counter 421 to which the target address used for performing the activation operation belongs, and/or a second block (e.g., BLK1) counter 422 to which the target address does not belong. Although the illustrated example shows the block counter in the bank counter in the case where one bank array includes two blocks, the number of block counters may correspond to the number of blocks included in one bank array depending on various example embodiments. For example, when one bank array includes four blocks, the bank counter may include four block counters. When one bank array includes seven blocks, the bank counter may include seven block counters.

For example, the memory controller 20 may control the memory device 100 to perform the activation operation such as writing data in the target address of the memory device 100, reading the stored data, and/or the like based on the activation command ACT CMD.

The memory controller 20 may also control the memory device 100 to perform the refresh operation based on the refresh command. For example, the controller control logic 21 may control the memory device 100 to perform the refresh operation based on the normal refresh command REF CMD or the refresh management command RFM CMD in some example embodiments. The normal refresh command REF CMD may be transmitted to the memory device 100 at, e.g., a preset (or alternately given) cycle, and the refresh management command RFM CMD may be transmitted to the memory device 100 based on, e.g., a result of comparison between the count value of the bank counter 400 and the RAAIMT and the RAAMMT or a preset (or alternately given) threshold count.

Alternatively, the controller control logic 21 may control the memory device 100 to simultaneously perform the activation operation for the target address and the refresh operation based on the activation-refresh command ACTR CMD. The refresh operation may be performed, for example, at the refresh address determined by the memory device 100 based on the monitoring result of the memory cell array.

In some example embodiments, the memory controller 20 may receive the rolling accumulated ACT initial management threshold (RAAIMT) count and/or the rolling accumulated ACT maximum management threshold (RAAMMT) count from the mode register 320 of the memory device 100. The controller control logic 21 may compare the received RAAIMT count and/or the received RAAMMT count with the count value updated whenever the command is transmitted, select any one of the activation command ACT CMD, the activation-refresh command ACTR CMD, a refresh management command RFM CMD, and/or the refresh command REF CMD based on the comparison result, and transmit the selected command to the memory device 100.

In some example embodiments, whenever the activation command ACT CMD is transmitted to the memory device 100, the memory controller 20 increases the count value of the block BLK to which the target address used for performing the activation operation belongs, e.g., a rolling accumulated ACT (RAA). When the activation-refresh command ACTR CMD is transmitted to the memory device 100, the memory controller 20 increases the count value of the block (e.g., the block BLK0) to which the target address belongs and decreases a preset (or alternately given) arbitrary count value of the block (the other blocks except the block BLK0) to which the target address does not belong by the execution of the refreshing operation. When the refresh command is transmitted to the memory device 100, the memory controller 20 decreases the count value of the block to which the refresh address determined by the memory device 100 belongs.

That is, the controller control logic 21 may transmit the activation-refresh command ACTR CMD, the refresh management command RFM CMD, and/or the refresh command REF CMD to the memory device 100 using a refresh counter. This will be described in detail with reference to FIGS. 9 and 10.

Figure 5:
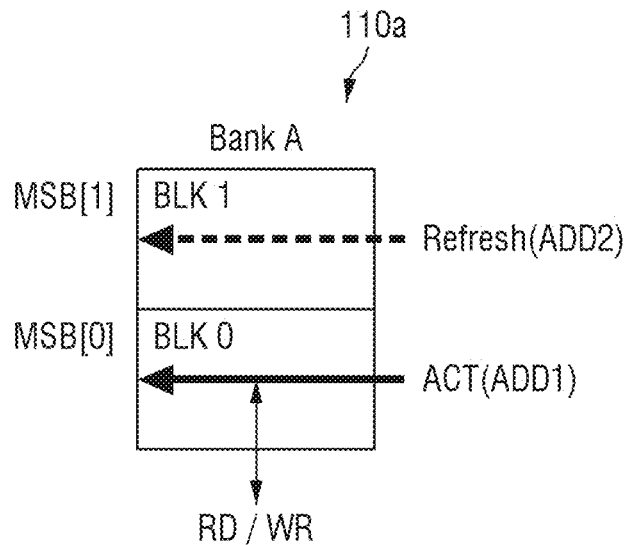
FIG. 5 is a conceptual diagram illustrating an operating method of a memory device according to some example embodiments.
Figure 6:
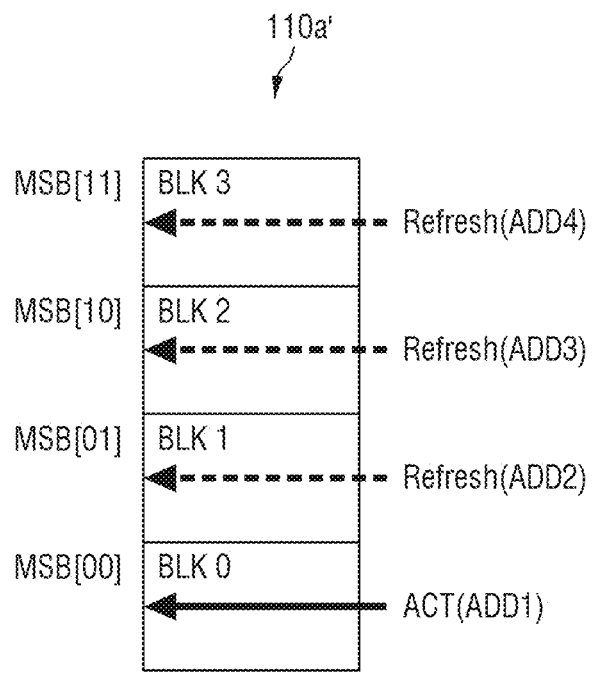
FIG. 6 is a conceptual diagram illustrating an operating method of a memory device according to some example embodiments.
Figure 7:
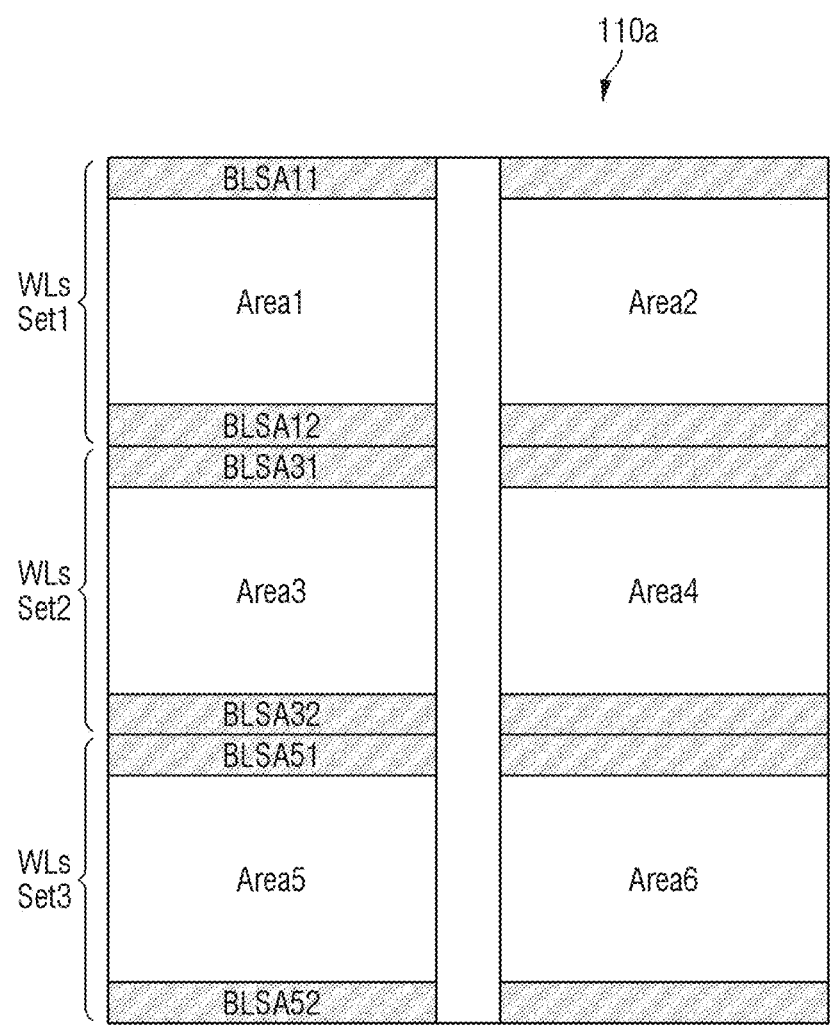
FIG. 7 is a conceptual diagram showing a bank array according to some example embodiments.

FIG. 5 is a conceptual diagram illustrating an operating method of a memory device according to some example embodiments. FIG. 6 is a conceptual diagram illustrating an operating method of a memory device according to some example embodiments. FIG. 7 is a conceptual diagram showing a bank array according to some example embodiments.

Referring to FIG. 5, in some example embodiments, when the activation-refresh command ACTR CMD is transmitted to the memory device 100, the memory control logic 300 may decode a target address ADD1 used for performing the activation operation and the internal command and generate the first control signal. Further, the memory control logic 300 may generate the refresh controller control signal.

The refresh controller 200 may generate the second control signal for performing the refresh operation based on the refresh controller control signal.

A word line of a refresh address ADD2 used for performing the refresh operation is different from the word line of the target address ADD1. The refresh address ADD2 may be any one word line address set by a preset (or alternately given) method among a plurality of word lines belonging to the plurality of bank arrays, respectively, in the memory device 100. For example, the refresh address ADD2 may be any one word line address selected in the bank array to which the target address ADD1 belongs. Alternatively, the refresh address ADD2 may be an address of any one word line selected among the plurality of word lines belonging to each or one or more block in the bank array. For example, the refresh address ADD2 may be any one word line address having a highest refresh priority based on a word line state in each (or one or more) bank array (e.g., reflecting a row-hammer state).

For example, while the activation driving voltage is being applied to the word line of the target address belonging to the first block BLK0, the refreshing driving voltage may be applied to the word line of the refresh address belonging to the second block BLK1. At this time, the second block BLK1 may be the other blocks except the first block BLK0 used for the activation operation (RD/WR) in one bank array.

Each or one or more of the plurality of blocks in one bank array may be classified as at least one MSB bit in some example embodiments. In the example shown in FIG. 5 in which one bank array is classified into two, the first block may be classified as MSB[0], and the second block may be classified as MSB[1]. In various example embodiments, the plurality of blocks may be classified as two or more MSB bits depending on the number of blocks.

For example, referring to FIG. 6, one bank array may include two or more blocks. Unlike FIG. 5, a bank array 110a' of FIG. 6 may include four blocks BLK0 to BLK3. In this case, each (or one or more) block may be classified as two or more most significant bits MSB in the word line address.

In the illustrated example, the block BLK0 may be classified as MSB[00], the block BLK1 may be classified as MSB[01], the block BLK2 may be classified as MSB[10], and/or the block BLK3 may be classified as MSB[11].

For example, when the target address belongs to the block BLK0 and the activation operation is performed in the block BLK0, at least one of the other blocks BLK1 to block BLK3 may perform the refresh operation.

In some example embodiments, all the blocks BLK1 to block BLK3 may perform the refresh operation. In this case, the blocks BLK1 to BLK3 may not share the bit line sensing area with other adjacent blocks. Alternatively, in some example embodiments, the other blocks BLK2 and/or BLK3 except the block BLK1 adjacent to the block BLK0 may perform the refresh operation. In this case, the block BLK1 and the block BLK0 may share the bit line sensing area in one example, and may not share the bit line sensing area in another example. Alternatively, in some example embodiments, the block BLK0 may perform the activation operation and only the block BLK2 may perform the refresh operation. In this case, the blocks BLK0 to BLK3 may share the bit line sensing area in one example, and may not share the bit line sensing area in another example.

The sharing of the bit line sensing area will be described in detail with reference to FIG. 7. The memory device 100 may include a plurality of bank arrays 110 (110a to 110h), and each or one or more of the bank arrays 110a to 110h may include a plurality of blocks.

In some example embodiments, the target address ADD1 includes the bank address ADDR and/or the row address ROW_ADDR, and any one of the plurality of row selection circuits 140 (e.g., the bank row selection circuit 140a) may be activated based on the bank address and the row address of the target address.

In any one bank array 110a connected to the activated bank row selection circuit 140a, the target address may belong to the first block BLK0 and the refresh address may belong to the second block BLK1. That is, the target address ADD1 and the refresh address ADD2 belong to different blocks in the same bank array. However, a bit line sensing circuit BLSA is not shared by the first block and the second block. That is, the first block is connected to a first bit line sensing circuit, and the second block is connected to a second bit line sensing circuit.

One bank array 110a may include a plurality of blocks Area1 to Area6. Each, or one or more block may include at least one bit line sensing circuit BLSA. In some example embodiments, the plurality of blocks may include individual bit line sensing areas. In some example embodiments, at least two blocks adjacent to a first side surface may share one bit line sensing area, but the blocks adjacent to a second side surface opposite to the first side surface may not share the bit line sensing area.

For example, in one illustrated example embodiment, the block Area1 may include bit line sensing circuits BLSA11 and BLSA12 at both ends thereof. Alternatively, in another example, the block Area1 may include a bit line sensing circuit at one end thereof.

Alternatively, in still another example, the block Area1 and the block Area3 adjacent to each other may share the bit line sensing circuit, and another block Area5 may not share the bit line sensing circuit with the block Area1. In this case, the target address may belong to the block Area1 and the refresh address may belong to the block Area5.

In this specification, the sharing of the bit line sensing circuit means that the bit line sensing circuit is electrically connected. For example, the sharing of the bit line sensing circuit between the block Area1 and the block Area3 adjacent to each other means that the block Area1 and the block Area3 are electrically connected to one bit line sensing circuit (e.g., BLSA A), but the bit line sensing circuit BLSA A cannot read first data of the block Area1 and second data of the block Area3 at the same time and only can sense the first data or the second data.

Figure 8:
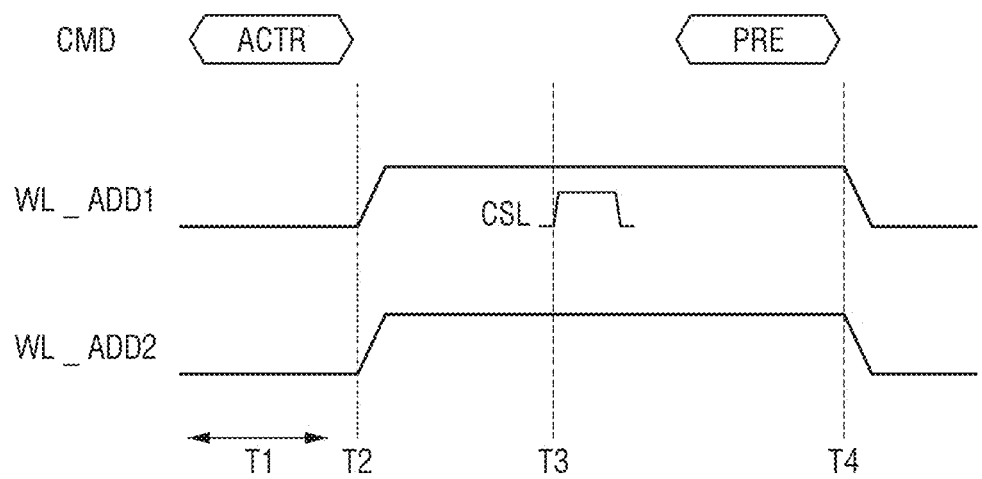
FIG. 8 is a timing diagram illustrating an operating method of a memory system according to some example embodiments.

FIG. 8 is a timing diagram illustrating an operating method of a memory system according to some example embodiments.

Referring to FIG. 8, when the activation-refresh command ACTR CMD is received through the control bus 11 during T1, the memory device 100 decodes the activation-refresh command ACTR CMD to extract the target address and the internal command.

The internal command generates the first control signal based on an internal activation command, e.g., RD CMD in the case of the read operation and/or WR CMD in the case of the write operation. Further, the internal command may include the refresh controller control signal for controlling the refresh controller 200.

The refresh controller 200 generates the second control signal that is enabled based on the refresh controller control signal to perform the refresh operation for the refresh address.

Based on the first control signal, the memory device 100 may apply the activation driving voltage to a word line WL_ADD1 of the target address ADD1 during the row active time tRAS before the pre-charge operation based on a pre-charge command is performed (T2 to T4). For example, a common sensing line (CSL) signal based on the internal command may be activated at T3 to perform the read operation or the write operation. Based on the second control signal, the memory device 100 may apply the refresh driving voltage to a word line WL_ADD2 of the refresh address ADD2. At this time, the refresh driving voltage may be applied simultaneously while the activation operation is being performed on the target address ADD1 (tRAS ADD1), e.g., between T2 and T4 (tRP_ADD2=tRAS ADD1).

Figure 9:
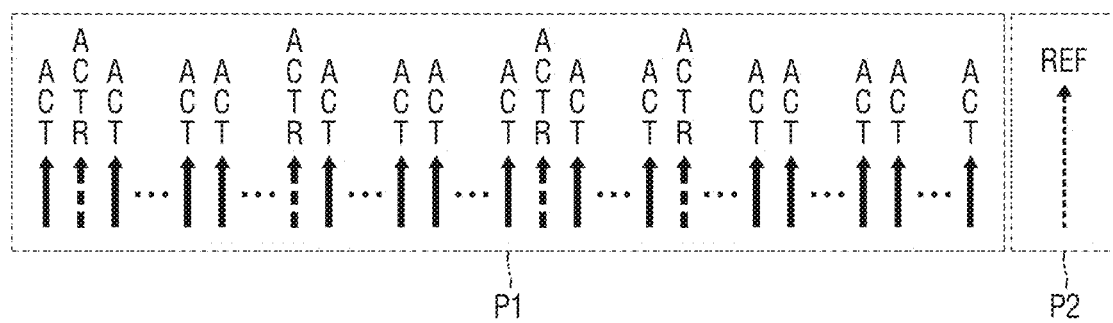
FIG. 9 is a command timing diagram illustrating an operating method of a memory controller according to some example embodiments.

FIG. 9 is a command timing diagram illustrating an operating method of a memory controller according to some example embodiments.

Referring to FIG. 9, the memory system 10 may repeatedly perform the operation of writing data in the memory device 100 and reading data from the memory device 100, e.g., the activation operation. The memory controller 20 may transmit the activation command ACT CMD to the memory device 100 in a P1 section to repeatedly perform the activation operation of reading data from the memory device 100 and/or writing data in the memory device 100.

However, due to the characteristics of the memory device 100, when the row-hammer phenomenon in which a specific word line is repeatedly accessed within a short period of time occurs, the memory device performs the refresh operation for data integrity. The row-hammer phenomenon means that when one row, e.g., a word line is repeatedly accessed, disturbance occurs in charges of cells connected to adjacent rows, and the charged charges are partially lost.

The refresh operation is performed by any one of the normal refresh command, the refresh management command RFM CMD, and/or the activation-refresh command. In one example, the memory controller 20 may periodically transmit the normal refresh command REF CMD in a P2 section based on preset (or alternately given) conditions to control the memory device to perform the refresh operation on the word line where the row-hammer phenomenon occurs. The normal refresh command REF CMD in the P2 section causes the memory controller 20 to mainly perform the refresh operation based on the state of the memory device 100. In this case, another activation operation is not performed at the same time.

In another example, the memory controller 20 may non-periodically transmit the refresh management command RFM CMD in the P1 section based on a result of comparison between a RAA count and the preset (or alternately given) conditions to control the memory device to perform the refresh operation on the word line in which the row-hammer phenomenon occurs. In this case, the activation operation is not performed. In this case, the memory controller 20 may transmit the refresh management command RFM CMD when a bank count value stored in the bank counter 400 exceeds a preset (or alternately given) refresh threshold value.

However, when the refresh command REF CMD and/or the refresh management command RFM CMD is not received for a long period of time and only the activation operation is performed continuously, a row-hammer mitigation operation is restricted, which may deteriorate the data integrity. On the other hand, when the normal refresh command REF CMD or the refresh management command RFM CMD is frequently transmitted to improve the data integrity, the activation operation is stopped and the refresh operation is performed, which may affect the operation speed of the memory device. Further, since the normal refresh command REF CMD performs the refresh operation on the entire memory cell, a refresh operation time tREF may be increased.

Therefore, in the P1 section in which the normal refresh command REF CMD is not received from the memory controller 20, the memory controller may transmit the activation-refresh command ACTR CMD. In this case, the memory controller 20 may transmit the activation-refresh command when the bank count value stored in the bank counter 400 and the block count value exceed the preset (or alternately given) refresh threshold value.

The activation-refresh command activates only one first block to which the target address belongs during the activation operation, so that it is possible to improve the data integrity and the operation speed of the memory device 100 by simultaneously performing the refresh operation on the other second blocks in the memory device.

The memory controller 20 may selectively transmit the normal activation command ACT CMD and the activation-refresh command ACTR CMD based on the count value stored in the counter 400 as shown in FIG. 9. The normal activation command ACT CMD may perform only the activation operation for the target address, and the activation-refresh command ACTR CMD may perform the activation operation for the target address and the refresh operation on the other blocks at the same time.

The criteria in which the memory controller 20 selectively transmits the normal activation command ACT CMD, the activation-refresh command ACTR CMD, the refresh management command RFM CMD, and the normal refresh command REF CMD will be described in detail with reference to FIG. 10.

Figure 10:
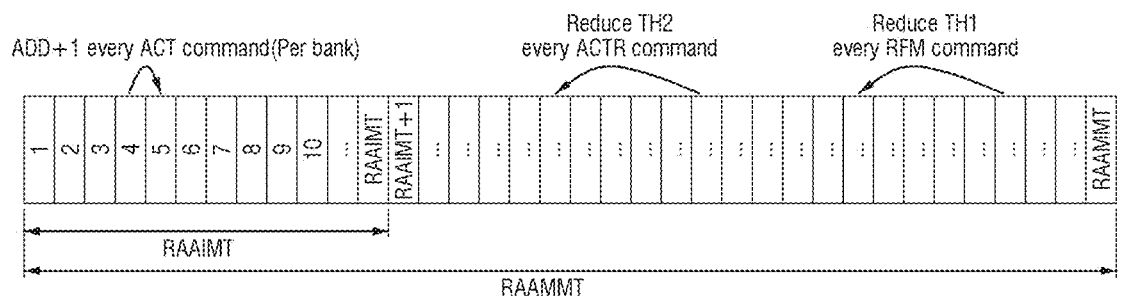
FIG. 10 is a conceptual diagram illustrating an operating method of a memory controller according to some example embodiments.

FIG. 10 is a conceptual diagram illustrating an operating method of a memory controller according to some example embodiments.

Referring to FIG. 10, the memory controller 20 updates the RAA count value whenever the command is transmitted to the memory device 100. The memory controller 20 may compare the RAAIMT count and the RAAMMT count that are initially received with the RAA count to determine a command to be transmitted to the memory device 100.

The RAA count may be increased or decreased within a maximum lifespan of a memory cell from when no activation operation is performed. The rolling accumulated ACT initial management threshold (RAAIMT) is a minimum RAA count value used for performing a first refresh operation, and the rolling accumulated ACT maximum management threshold (RAAMMT) is a maximum value of the RAA count and may indicate a maximum lifespan of the memory cell. The RAAIMT count and the RAAMMT count are initial set values that are preset (or alternately given) and stored in the mode register set 320 of the memory device 100.

In some example embodiments, when the activation command ACT CMD is transmitted, the memory controller 20 increases the RAA count stored in the block counter 421 for the first block of the target address by 1. Alternatively, in some example embodiments, when the activation-refresh command ACTR CMD is transmitted, the memory controller 20 increases the RAA count stored in the block counter 421 for the first block of the target address by 1 and decreases the RAA count stored in the block counter 422 for the second block by a preset (or alternately given) threshold Th2. Alternatively, in some example embodiments, when the normal refresh command REF CMD or the refresh management command RFM CMD is transmitted, the memory controller 20 decreases the RAA count stored in the bank counter 400 for the entire bank array by a preset (or alternately given) threshold Th1. The threshold decreased by the activation-refresh command ACTR CMD and the threshold decreased by the refresh management command RFM CMD may be the same or different depending on various example embodiments. Alternatively, the threshold decreased by the activation-refresh command may be smaller than or equal to the threshold decreased by the normal refresh command according to some example embodiments.

In some example embodiments, the memory controller 20 includes a preset (or alternately given) first refresh threshold for generating the activation-refresh command ACTR CMD, and generates the activation-refresh command ACTR CMD when the RAA count of a current specific block counter exceeds the first refresh threshold.

In some example embodiments, the memory controller 20 includes a preset (or alternately given) second refresh threshold for generating the RFM command, and generates the refresh management command RFM CMD when the RAA count of the current specific block counter exceeds the second refresh threshold. In some example embodiments, the second refresh threshold may be smaller than the first refresh threshold.

For example, when one bank array includes two blocks as shown in FIG. 5, there may be two block counts. When the activation operation is performed in the first block, the first block count of the first block increases. Since, however, the refresh operation is performed in the second block, the second block count of the second block may be decreased by the preset (or alternately given) threshold Th2.

Figure 11:
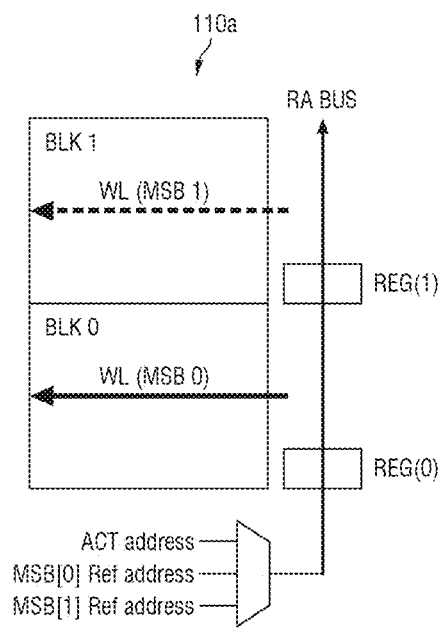
FIG. 11 is a conceptual diagram illustrating an operating method of a memory device according to some example embodiments.

FIG. 11 is a conceptual diagram illustrating an operating method of a memory device according to some example embodiments.

Referring to FIG. 11, the memory device 100 may include a plurality of registers REG that respectively belong to the plurality of bank arrays and are mapped for each or one or more block. The register REG may be included in the mode register set 320 in the memory control logic 300 in some example embodiments, may be included in the refresh controller 200 in some example embodiments, and may be configured separately from the refresh controller 200 in some example embodiments.

The register REG stores the refresh address of the mapped block. Since each or one or more block BLK is connected to the plurality of word lines, the refresh controller 200 may monitor the row-hammer state for each or one or more of the blocks BLK0 and BLK1 and store address information for any one of the plurality of word lines in each or one or more of registers REG(0) and REG(1).

In some example embodiments, the refresh address stored in the register REG by the refresh controller 200 may be a next refresh address for performing the refresh operation in a next activation operation period while the memory device 100 is performing the pre-charge operation. For example, the address of any one word line having a worst row-hammer state among the monitored row-hammer states of the plurality of word lines belonging to the block may be stored in the register REG. The refresh address stored in the register REG may be updated based on the monitored row-hammer state.

Each or one or more register REG may be connected to a row address bus (RA bus) and receive a target address (ACT address) based on the activation command and refresh addresses (MSB[0] Ref address and MSB[1] Ref address) for each or one or more block determined by the refresh controller 200. The refresh controller 200 may compare the refresh address stored in the register REG with the address received through the row address bus, and determine whether to perform the refresh operation or not based on the comparison result. This will be described in detail with reference to FIGS. 12A to 12D.

FIGS. 12A to 12D are conceptual diagrams illustrating an operating method of a memory device according to some example embodiments.

Figure 12A:
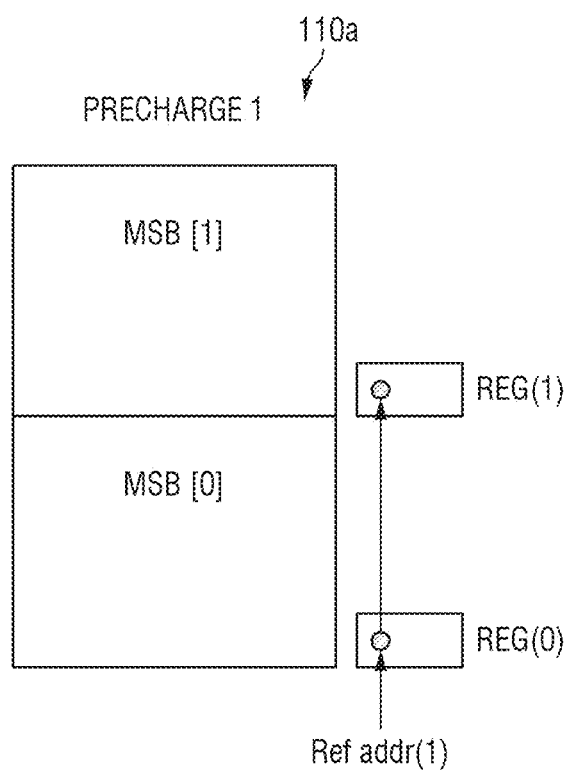
FIGS. 12A to 12D are conceptual diagrams illustrating an operating method of a memory device according to some example embodiments.

Referring to FIG. 12A, while the memory device 100 is performing a first pre-charge operation (PRECHARGE 1), the refresh controller 200 stores a refresh address REF addr(1) based on memory state information of each or one or more block in each or one or more of the registers REG(0) and REG(1).

Figure 12B:
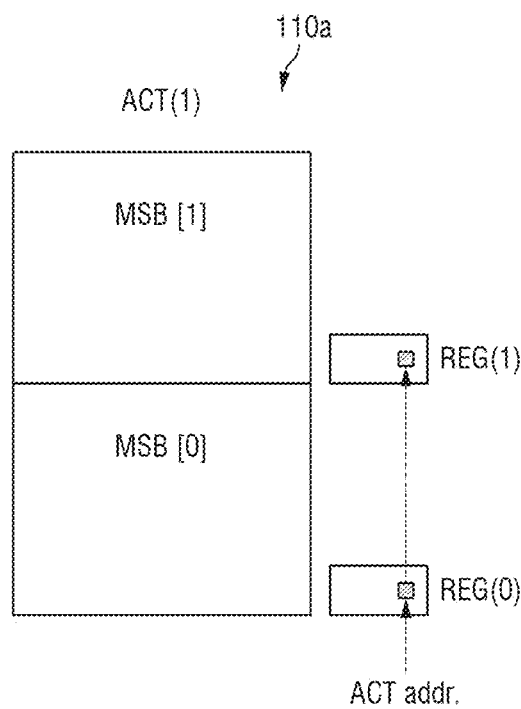
Figure 12C:
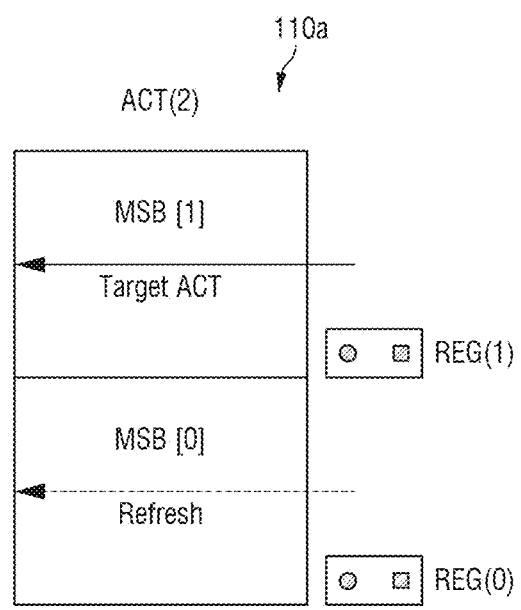

Referring to FIGS. 12B and 12C, the memory device 100 decodes the target address (ACT addr) used for performing the activation operation based on the activation-refresh command, transmits it to the RA bus, and compares the refresh addresses stored in the registers REG(0) and REG(1) with the target address.

As a result of the comparison, in the first block (MSB[1]) to which the target address belongs, the activation operation is performed during the row active time tRAS, and in the second block (MSB[0]) to which the target address does not belong, the refresh operation is performed at the same time.

Figure 12D:
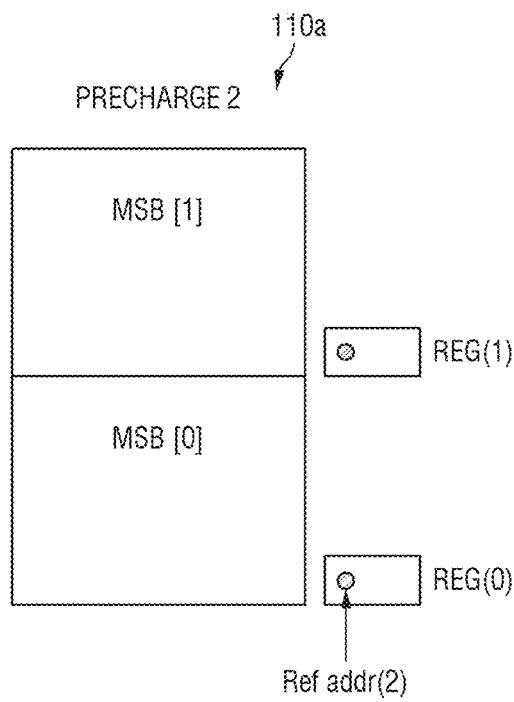

Referring to FIG. 12D, when the activation operation of the memory device 100 is completed and a second pre-charge operation (PRECHARGE2) is performed again, the register REG(0) of the block in which the refresh operation has been performed stores a new refresh address REF addr(2) based on the row-hammer state information.

In some example embodiments, the monitored row-hammer state information in FIGS. 12A to 12D may be stored as the RAA counter value described with reference to FIG. 10 in the memory controller 20, and the memory controller 20 may receive the RAA counter value as an MR bit or the like. Then, the memory controller 20 selectively transmits any one of the activation command, the activation-refresh command, and/or the refresh command based on the MR bit.

Figure 13:
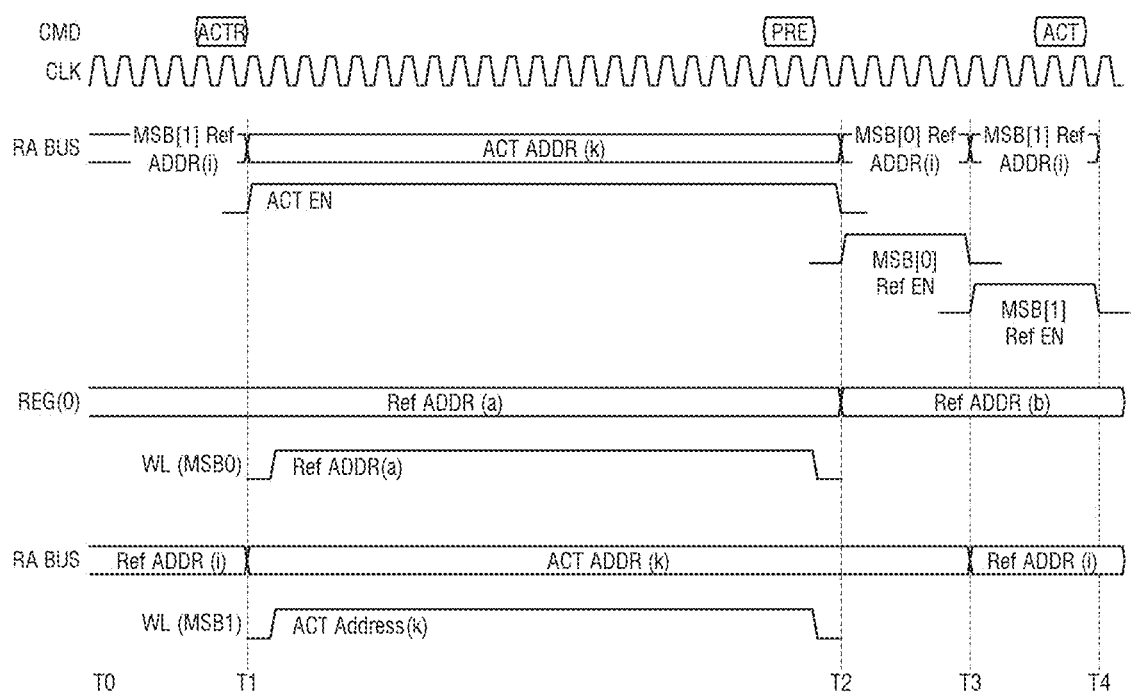
FIG. 13 is a timing diagram illustrating an operating method of a memory system according to some example embodiments.

FIG. 13 is a timing diagram illustrating an operating method of a memory system according to some example embodiments.

Referring to FIG. 13, the memory device 100 may store a refresh address Ref ADDR(i) in the registers REG[0] and REG[1] of each or one or more block through the RA bus during a first pre-charge period (T0-T1).

The memory device 100 may activate the activation operation during the row active time tRAS (T1 to T2) in a memory cell of a target address ADDR(k) transmitted to the RA bus based on the internal activation command ACT CMD (ACT EN). At this time, the target address ADDR(k) corresponds to the first block (MSB[1]).

The memory device 100 performs the refresh operation on the second block (MSB[0]) in which the activation operation is not performed in an activation period (T1 to T2). The refresh operation may be performed for a refresh address MSB[0] REF ADDR(a) stored in the register REG[0].

The memory device 100 performs the pre-charge operation between T2 and T4 based on an internal pre-charge command PRE CMD. During the pre-charge operation, the refresh controller 200 may transmit the refresh addresses MSB[0] Ref ADDR(i) and MSB[1] Ref ADDR(i) to the register of each or one or more block through the RA bus and update the stored refresh address.

Thus, according to example embodiments, by simultaneously performing the refresh operation on the other second blocks a row-hammer phenomenon may be reduced or prevented and performance of a memory device may be improved by improving data integrity and operation speed of the memory device.

Figure 14:
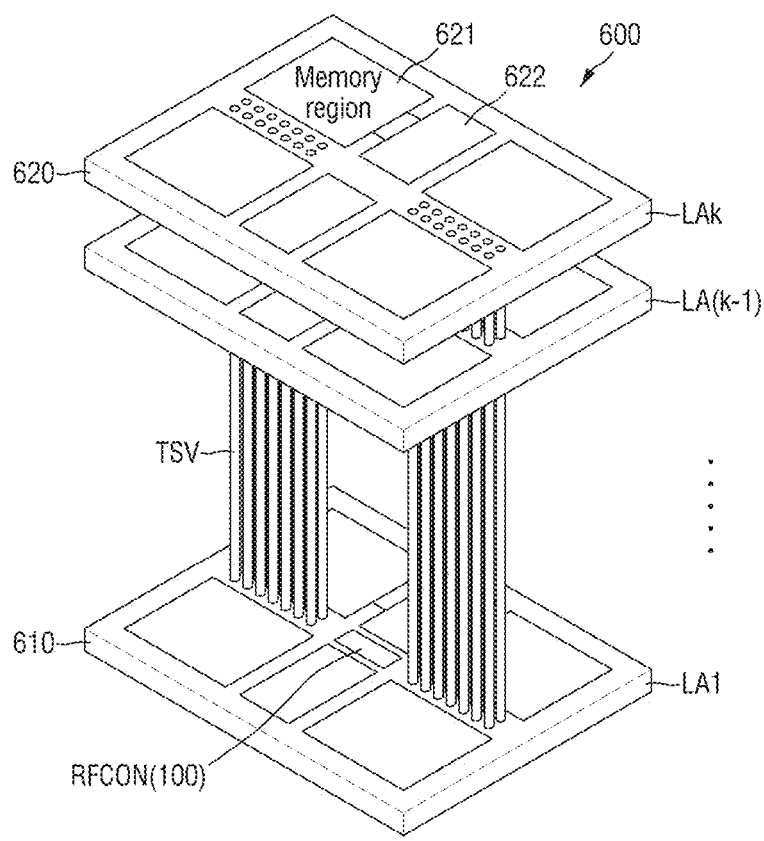
FIG. 14 is a diagram illustrating a stacked memory device according to example embodiments.

FIG. 14 is a diagram illustrating a stacked memory device according to example embodiments.

Referring to FIG. 14, a semiconductor memory device 600 may include first through kth semiconductor integrated circuit layers LA1 through LAk, in which the lowest first semiconductor integrated circuit layer LA1 is assumed to be an interface or control chip and the other semiconductor integrated circuit layers LA2 through LAk are assumed to be slave chips including core memory chips. The slave chips may form a plurality of memory ranks as described above.

The first through kth semiconductor integrated circuit layers LA1 through LAk may transmit and/or receive signals between the layers by through-substrate vias TSVs (e.g., through-silicon vias). The lowest first semiconductor integrated circuit layer LA1 as the interface or control chip may communicate with an external memory controller through a conductive structure formed on an external surface.

Each, or at least one, of the first semiconductor integrated circuit layer 610 through the kth semiconductor integrated circuit layer 620 may include memory regions 621 and peripheral circuits 622 for driving the memory regions 621. For example, the peripheral circuits 622 may include a row-driver for driving wordlines of a memory, a column-driver for driving bit lines of the memory, a data input-output circuit for controlling input-output of data, a command buffer for receiving a command from an outside source and buffering the command, and/or an address buffer for receiving an address from an outside source and buffering the address.

The first semiconductor integrated circuit layer 610 may further include a control circuit 100. The control circuit 100 may control access to the memory region 621 based on a command and an address signal from a memory controller and may generate control signals for accessing the memory region 621.

Each, or at least one, of the semiconductor integrated circuit layers LA2 through LAk corresponding to the slave layer may include a refresh control circuit as described above. The refresh control circuit may include a hammer address manager for managing the access addresses synthetically with respect to a plurality of memory banks.

Figure 15:
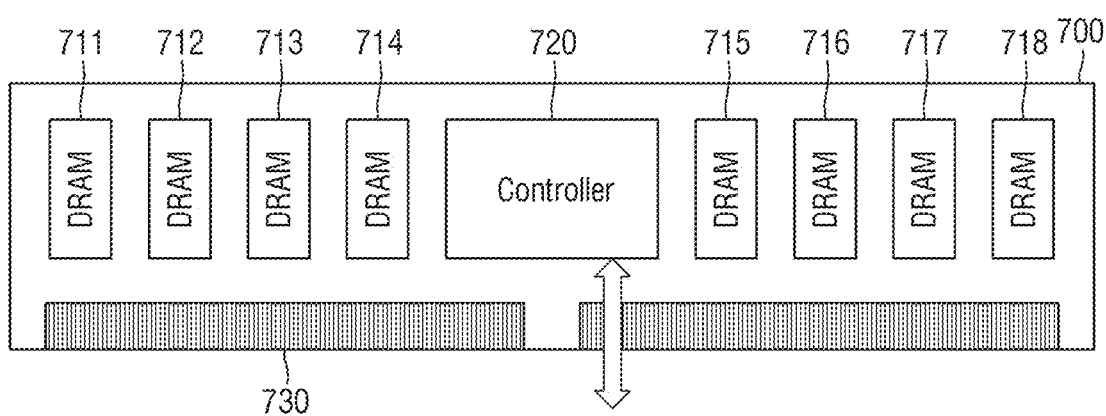
FIG. 15 is a diagram illustrating a memory module according to an example embodiment of the present disclosure.

FIG. 15 is a diagram illustrating a memory module according to an example embodiment of the present disclosure.

Referring to FIG. 15, according to some example embodiments, the main memory device 700 may be mounted on an electronic device in the form of a memory module. One or more main memory devices 700 may be mounted.

The main memory device 700 may include a plurality of volatile memories 711-718, a controller 720 and/or memory input/output pins 730. The main memory device 700 may write data therein or output the written data under the control of CPU in the electronic device. For example, when the main memory device 700 includes a DRAM, the CPU may control the main memory device 700 in compliance with a standard promulgated by JEDEC, such as JESD79F for double data rate (DDR) SDRAM and JESD209 for low power DDR (LPDDR). For example, in order to read data stored in the main memory device 100, the CPU transmits a command and an address to the main memory device 100.

The plurality of volatile memories 711 to 718 may be at least one of DRAM, SRAM, and/or SDRAM according to some example embodiments. Each or one or more of the volatile memories 711 to 718 may transmit and receive data (DQ) through a channel CH in response to a signal provided from the controller 720. According to some example embodiments, the main memory device 700 may further include data buffers (not shown) for data communication, and the data buffers (not shown) may transmit and receive data (DQ) to/from the controller 720 in synchronization with data strobe signals (DQS).

According to some example embodiments, the controller 720 may communicate with the volatile memories 711 to 718 in compliance with one of module types such as a dual in-line memory module (DIMM), registered DIMM (RDIMM), load reduced DIMM (LRDIMM), and/or unregistered DIMM (UDIMM).

According to some example embodiments, the controller 720 may receive a command/address CA and a clock signal CK through the channel CH and provide the received signals to the volatile memories 711 to 718.

Figure 16:
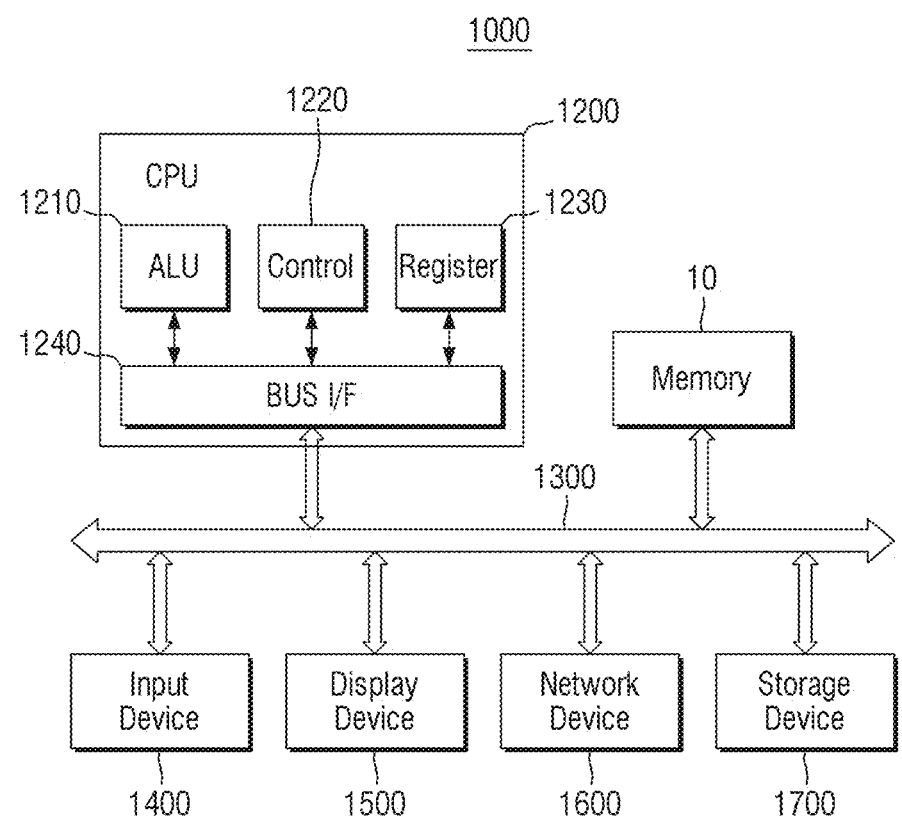
FIG. 16 is a block diagram illustrating an electronic device according to an example embodiment of the present disclosure.

FIG. 16 is a block diagram illustrating an electronic device according to an example embodiment of the present disclosure.

Referring to FIG. 16, an electronic device 1000 according to some example embodiments may include one of a computer, a laptop, an ultra mobile PC (UMPC), a workstation, a server computer, a net-book, a PDA, a portable computer, a web tablet, a wireless phone, a mobile phone, a smart phone, a digital camera, a digital audio recorder, a digital audio player, a digital picture recorder, a digital picture player, a digital video recorder, a digital video player, a device capable of transmitting and/or receiving information in a wireless environment, and/or various electronic devices constituting a home network.

According to some example embodiments, the electronic device 1000 may include a main memory device 10, a central processing unit (CPU) 1200, and/or a system management bus 300. According to some example embodiments, the electronic device 1000 may further include an input device 1400, a display device 1500, a network device 1600, and/or a storage device 1700.

The main memory device 10 may store data processed by the CPU 200 therein or may operate as a working memory of the CPU 1200. According to some example embodiments, the main memory device 10 may be a DRAM such as a double data rate synchronous dynamic random access memory (DDR SDRAM), a low power double data rate (LPDDR) SDRAM, a graphics double data rate (GDDR) SDRAM, and/or a Rambus DRAM (RDRAM), and/or any volatile memory device requiring a refresh operation.

The main memory device 10 may be fabricated using a semiconductor. The processing speed of the main memory device 10 may be higher than that of the storage device 1700. In other words, it may be a memory which loses its stored contents when power is cut off.

The CPU 1200 may include various arbitrary processors according to some example embodiments. It may be a device which decodes instructions of the electronic device and executes arithmetic and/or logic operations and/or data processing. According to some example embodiments, the CPU 1200 may include a program counter, an arithmetic and logic unit (ALU) 1210, a control unit 1220, various registers 1230, an instruction decoding unit, a timing generation circuit, and/or the like.

The ALU 1210 may execute arithmetic and logic operations for performing the instruction of the electronic device 1000.

According to some example embodiments, the register 1230 may store logs related to the operation state of the electronic device 1000. According to some example embodiments, the control unit 220 may write a log of the operation state of the electronic device 1000 in the register 1230 in real time while performing the operation of the electronic device 1000. According to some example embodiments, the register 1230 may store the log with time information including the time at which the operation is performed. The register 1230 may be, for example, a polling register of a basic input/output system (BIOS) or a register that stores system event logs from a baseboard management controller (BMC).

According to some example embodiments, the CPU 1200 may include a single core and/or multiple cores to process data. For example, the CPU 1200 may include multiple cores (multi-core) such as two cores (dual-core), four cores (quad-core), and/or six cores (hexa-core). In addition, according to some example embodiments, the CPU 1200 may further include a cache memory located inside or outside it.

The input device 1400 includes various devices that input data or commands to the electronic device 1000. For example, the input device 1400 may be user input devices such as a keyboard, keypad, button, touch panel, touch screen, touch pad, touch ball, camera, microphone, gyroscope sensor, vibration sensor, piezoelectric element, temperature sensor, and/or biometric sensor.

The display device 1500 includes various devices that output data to the outside. For example, the display device 1500 may include user output devices such as a liquid crystal display (LCD), organic light emitting diode (OLED) display, active matrix OLED (AMOLED) display, LED, speaker, and/or motor.

The network device 1600 may be a transceiving device that enables communications with a device outside the electronic device 1000. The network device 1600 may be a wired transceiving device according to some example embodiments, and/or a wireless transceiving device according to some example embodiments.

The storage device 1700 may exist outside the CPU 1200. The storage device 1700 may be used to supplement the limited storage capacity of the main memory device 10. The storage device 1700 does not lose the stored contents even when the power is cut off. That is, the storage device 1700 may be a nonvolatile memory. The processing speed of the storage device 1700 may be relatively slower than that of the main memory device 10. However, it may store a large amount of data semi-permanently.

The storage device 1700 may also use a semiconductor. The storage device 1700 may be a hard disk drive (HDD) using a magnetic disk according to some example embodiments, and/or may be a solid state drive (SSD) using a semiconductor instead of the magnetic disk according to some example embodiments.

The bus 1300 may include various communication links. According to some example embodiments, the bus 1300 may be a system management bus (SMBus), inter-integrated circuit (I2C) bus, intelligent platform management interface (IPMI) compliant bus, Modbus, and/or the like.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

In concluding the detailed description, those skilled in the art will appreciate that many variations and modifications can be made to the example embodiments without substantially departing from the principles of the present disclosure. Therefore, the disclosed example embodiments are used in a generic and descriptive sense only and not for purposes of limitation.

What is claimed is:

1. An operating method of a memory device, comprising:
   receiving an activation-refresh command from a memory controller;
   decoding a target address and an internal command from the activation-refresh command; and
   performing an activation operation on the target address in a first block of a memory bank based on the internal command and performing a refresh operation on a second block of the memory bank to which the target address does not belong,
   wherein the memory device includes a plurality of memory banks and each of the plurality of memory banks includes a plurality of blocks, each including at least one bit line sensing area.

2. The operating method of claim 1, wherein the first block and the second block do not share a bit line sensing area (BLSA).

3. The operating method of claim 1, wherein the memory device includes a plurality of registers mapped respectively to the plurality of blocks, the method further comprising:
   storing, in each of the registers, a refresh address in a plurality of rows belonging to the mapped block.

4. The operating method of claim 3, further comprising:
   updating the refresh address in the registers while the memory device performs a pre-charge operation.

5. The operating method of claim 3, wherein the refresh address stored in the register is an address selected based on a row-hammer state in the mapped block.

6. The operating method of claim 1, further comprising:
   selectively transmitting, by the memory controller, an activation command and the activation-refresh command to the memory device.

7. The operating method of claim 6, further comprising:
   transmitting, by the memory controller, a refresh management (RFM) command, independently of the activation-refresh command, to the memory device.

8. A memory device comprising:
   a memory control logic configured to generate a first control signal for performing an activation operation for a target address based on an activation-refresh command received from a memory controller;
   at least one memory bank including a first block to which the target address belongs and a plurality of second blocks to which the target address does not belong;
   a refresh controller configured to generate a second control signal for performing a refresh operation on a refresh address in at least one block among the plurality of second blocks;
   a bank control logic configured to output a bank control signal for activating the memory bank to which the target address belongs; and
   a plurality of bank row selection decoders, at least one of which is configured to be selected and activated based on the first control signal, the second control signal, and the bank control signal,
   wherein the activated bank row selection decoder is configured to, in an activation period, apply an activation driving voltage to a word line of the target address, and simultaneously apply a refresh driving voltage to a word line of the refresh address, and
   the refresh address belongs to the at least one block among the plurality of second blocks.

9. The memory device of claim 8, wherein the first block and the second block are different blocks that do not share a bit line sensing area (BLSA).

10. The memory device of claim 8, further comprising a plurality of registers mapped respectively to the plurality of second blocks, the plurality of registers storing at least one block refresh address.

11. The memory device of claim 10, wherein the refresh controller is configured to update the at least one block refresh address stored in the register while the memory device performs a pre-charge operation.

12. The memory device of claim 11, wherein the refresh controller is configured to:
   monitor row-hammer states of all rows belonging to each of the blocks; and
   determine an address of a row having a worst row-hammer state as the block refresh address.

13. The memory device of claim 11, wherein the refresh controller is configured not to perform the refresh operation on a block in which the stored block refresh address is equal to the target address in the same activation period.

14. The memory device of claim 8, wherein the memory control logic is configured to receive an activation command and the activation-refresh command which are selectively transmitted.

15. The memory device of claim 14, wherein the memory controller includes:
   a first block counter for the first block to which the target address belongs; and
   a second block counter for the at least one block among the plurality of second blocks to which the target address does not belong.

16. The memory device of claim 15, wherein the memory controller is configured to increase a count value of the first block counter and decrease a count value of the second block counter in response to transmitting the activation-refresh command.

17. The memory device of claim 15, wherein the memory controller is configured to selectively transmit a refresh management (RFM) command or the activation-refresh command based on count values of the first and second block counters.

18. An operating method of a memory system, the method comprising:
- transmitting, by a memory controller, an activation-refresh command to a memory device; and
- performing, by the memory device, an activation operation at a target address of a first block of a memory bank while performing a refresh operation in a second block of the memory bank,
- wherein the memory device includes a plurality of memory banks and each of the plurality of memory banks includes a plurality of blocks, each including at least one bit line sensing area.

19. The operating method of claim 18, wherein the memory controller includes a first block counter corresponding to the first block and a second block counter corresponding to the second block, and the method further includes
- increasing or decreasing, by the memory controller, a count value of the first or second block counter in response to an activation command, the activation-refresh command, or a refresh management (RFM) command being transmitted to the memory device.

* * * * *